United States Patent
Sugawara et al.

(10) Patent No.: US 11,374,098 B2
(45) Date of Patent: Jun. 28, 2022

(54) HIGH ELECTRON MOBILITY TRANSISTOR INCLUDING A GATE ELECTRODE LAYER SPACED APART FROM A SILICON NITRIDE FILM

(71) Applicants: SUMITOMO ELECTRIC INDUSTRIES, LTD., Osaka (JP); SUMITOMO ELECTRIC DEVICE INNOVATIONS, INC., Kanagawa (JP)

(72) Inventors: Kenta Sugawara, Osaka (JP); Yukinori Nose, Yokohama (JP)

(73) Assignees: SUMITOMO ELECTRIC INDUSTRIES, LTD., Osaka (JP); SUMITOMO ELECTRIC DEVICE INNOVATIONS, INC., Kanagawa (JP)

( * ) Notice: Subject to any disclaimer, the term of this patent is extended or adjusted under 35 U.S.C. 154(b) by 21 days.

(21) Appl. No.: 16/279,649

(22) Filed: Feb. 19, 2019

(65) Prior Publication Data
US 2019/0259843 A1 Aug. 22, 2019

(30) Foreign Application Priority Data
Feb. 19, 2018 (JP) .............................. JP2018-026770

(51) Int. Cl.
*H01L 29/15* (2006.01)
*H01L 29/40* (2006.01)
(Continued)

(52) U.S. Cl.
CPC .......... *H01L 29/408* (2013.01); *H01L 21/022* (2013.01); *H01L 21/0217* (2013.01);
(Continued)

(58) Field of Classification Search
CPC . H01L 29/408; H01L 29/2003; H01L 29/205; H01L 29/42316; H01L 29/475; H01L 29/7786; H01L 29/7787
(Continued)

(56) References Cited

U.S. PATENT DOCUMENTS

2005/0151255 A1    7/2005  Ando et al.
2010/0308373 A1*  12/2010  Nagahisa ............ H01L 29/7787
                                                              257/192
(Continued)

FOREIGN PATENT DOCUMENTS

JP    2004-22773     1/2004
JP    2014-199864   10/2014
JP    2017-59621     3/2017

*Primary Examiner* — Phuc T Dang
(74) *Attorney, Agent, or Firm* — Smith, Gambrell & Russell, LLP

(57) ABSTRACT

A semiconductor device and a process of forming the semiconductor device are disclosed. The semiconductor device type of a high electron mobility transistor (HEMT) has double SiN films on a semiconductor layer, where the first SiN film is formed by the lower pressure chemical vapor deposition (LPCVD) technique, while, the second SiN film is deposited by the plasma assisted CVD (p-CVD) technique. Moreover, the gate electrode has an arrangement of double metals, one of which contains nickel (Ni) as a Schottky metal, while the other is free from Ni and covers the former metal. A feature of the invention is that the first metal is in contact with the semiconductor layer but apart from the second SiN film.

12 Claims, 7 Drawing Sheets

(51) Int. Cl.
    *H01L 29/20*     (2006.01)
    *H01L 29/205*     (2006.01)
    *H01L 29/47*     (2006.01)
    *H01L 29/66*     (2006.01)
    *H01L 21/02*     (2006.01)
    *H01L 21/311*     (2006.01)
    *H01L 21/285*     (2006.01)
    *H01L 29/778*     (2006.01)
    *H01L 29/423*     (2006.01)
    *H01L 29/417*     (2006.01)
    *H01L 21/027*     (2006.01)

(52) U.S. Cl.
    CPC .. *H01L 21/02211* (2013.01); *H01L 21/02271* (2013.01); *H01L 21/02274* (2013.01); *H01L 21/28581* (2013.01); *H01L 21/31116* (2013.01); *H01L 29/2003* (2013.01); *H01L 29/205* (2013.01); *H01L 29/42316* (2013.01); *H01L 29/475* (2013.01); *H01L 29/66462* (2013.01); *H01L 29/7786* (2013.01); *H01L 29/7787* (2013.01); *H01L 21/0272* (2013.01); *H01L 29/41766* (2013.01)

(58) Field of Classification Search
    USPC .................................. 257/76, 194, E29.246
    See application file for complete search history.

(56) References Cited

U.S. PATENT DOCUMENTS

| | | | |
|---|---|---|---|
| 2014/0001640 A1* | 1/2014 | Nishizawa | H01L 29/66462 257/773 |
| 2014/0197460 A1* | 7/2014 | Makiyama | H01L 21/02274 257/194 |
| 2014/0291774 A1 | 10/2014 | Nishi | |
| 2015/0333138 A1 | 11/2015 | Nishi | |
| 2016/0325987 A1 | 11/2016 | Dellas | |
| 2017/0077275 A1 | 3/2017 | Okazaki et al. | |

\* cited by examiner

PRIOR ART

HIGH ELECTRON MOBILITY TRANSISTOR INCLUDING A GATE ELECTRODE LAYER SPACED APART FROM A SILICON NITRIDE FILM

CROSS REFERENCE TO RELATED APPLICATION

The present application is based on and claims benefit of priority of Japanese Patent Application No. 2018-026770, filed on Feb. 19, 2018, the entire content of which is incorporated herein by reference.

BACKGROUND OF INVENTION

1. Field of Invention

The present invention relates to a semiconductor device, in particular, a semiconductor device primarily made of nitride semiconductor materials, and a process of forming the semiconductor device.

2. Related Background Art

A semiconductor device type of a high electron mobility transistor (HEMT) primarily made of nitride semiconductor materials has been well known in the field and gradually entered in a phase of a practical application. Prior Japanese patent documents laid open Nos. JP2017-059621A and JP2004-022773A have disclosed HEMTs providing a gallium nitride (GaN) layer and an aluminum gallium nitride (AlGaN) layer stacked on the GaN layer, where those two layers induce a two-dimensional electron gas (2DEG) in an interface therebetween to show an excellent modulating performance of the HEMT.

Such a HEMT made of nitride semiconductor materials often provides a gate electrode containing nickel (Ni) to realize a good Schottky contact against a nitride semiconductor layer. When such a HEMT also includes a silicon nitride (SiN) film to protect the gate electrode physically and chemically, Ni atoms easily diffuse into the SiN film to form nickel silicide, which may modifies a shape of the gate electrode. For instance, when a gate electrode with a length thereof shorter than 200 nm; the Ni diffusion possibly eliminates a portion of the gate electrode, which degrades the performance of the HEMT, for instance, an increase of the gate resistance, an increase of the gate leak current, and so on. Accordingly, the Ni diffusion into the SiN film is necessary to be prevented.

SUMMARY OF INVENTION

One aspect of the present invention relates to a semiconductor device type of a high electron mobility transistor (HEMT). The semiconductor device comprises a semiconductor layer provided on a substrate, a first silicon nitride (SiN) film provided on the semiconductor layer, a second SiN film provided on the first SiN film, a first metal containing nickel (Ni), and a gate electrode including a first metal and a second metal. The first SiN film has an opening and the second SiN film has another opening that overlaps with and covers the opening in the first SiN film. The first metal in the gate electrode is in contact with the semiconductor layer exposed in the opening in the first SiN film but apart from the second SiN film. The second metal covers the first metal and fills another opening in the second SiN film.

Another aspect of the present invention relates to a process of forming a semiconductor device type of a high electron mobility transistor. The process includes steps of: (a) growing a semiconductor layer epitaxially on a substrate; (b) depositing a first silicon nitride (SiN) film on the semiconductor layer by a low pressure chemical vapor deposition (LPCVD) technique; (c) depositing a second SiN film on the first SiN film by a plasma assisted chemical vapor deposition (p-CVD) technique; (d) forming an opening in the first SiN film and another opening in the second SiN film by selectively etching the second SiN film and the first SiN film sequentially using a reactive gas containing fluorine (F), where the another opening in the second SiN film overlapping with and fully covering the opening in the first SiN film; (e) depositing a first metal containing nickel (Ni) in the first opening of the first SiN film; and (f) depositing a second metal so as to cover the first metal and fill the second opening in the second SiN film. In the semiconductor device of the present invention, the first metal and the second metal form a gate electrode. A feature of the process of the invention is that the deposition of the first metal is carried out such that the first metal covers the semiconductor layer exposed in the first opening without in contact with the second SiN film.

BRIEF DESCRIPTION OF THE DRAWINGS

The foregoing and other purposes, aspects and advantages will be better understood from the following detailed description of a preferred embodiment of the invention with reference to the drawings, in which.

DESCRIPTION OF EMBODIMENTS

Next, some embodiments according to the present invention will be described referring to accompanying drawings. In the description of the drawings, numerals or symbols same with or similar to each other will refer to elements same with or similar to each other without duplicating explanations.

Figure 1:
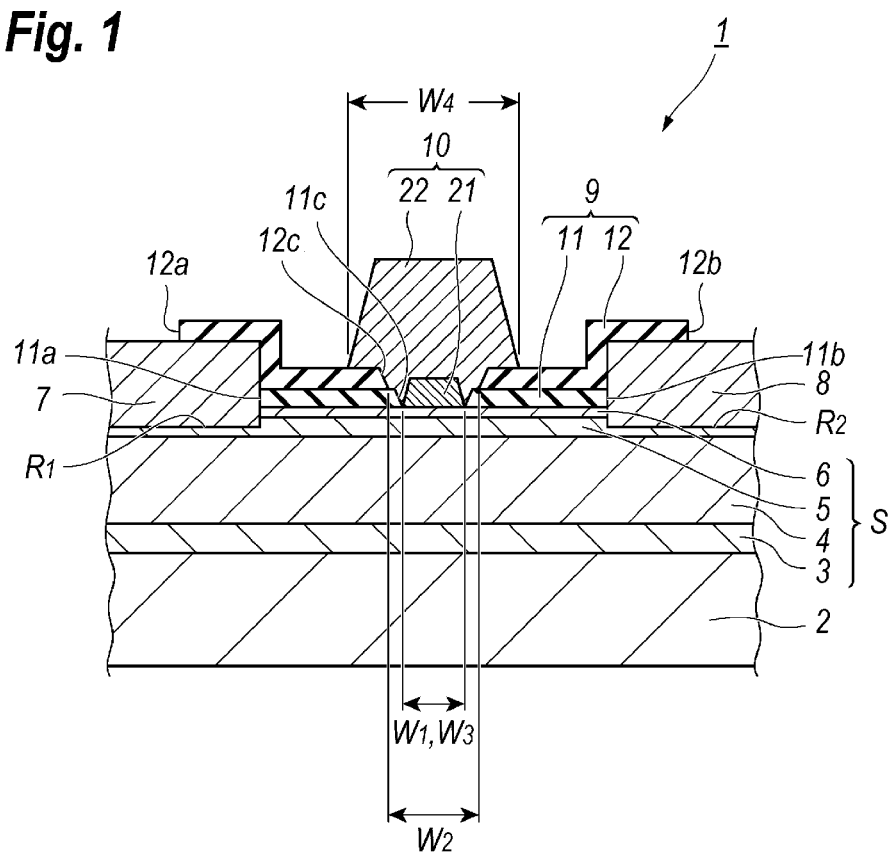
FIG. 1 is a cross sectional view of a semiconductor device according to the first embodiment of the present invention.

FIG. 1 is a cross sectional view of a semiconductor device type of a high electron mobility transistor (HEMT) according to an embodiment of the present invention. The HEMT 1 provides, as shown in FIG. 1, a substrate 2, a buffer layer 3, a channel layer 4, a barrier layer 5, a cap layer 6, a passivation film 9, and electrodes of a source 7, a drain 8, and a gate 10, where the layers from the buffer layer 3 to the cap layer 6 form a semiconductor stack S, are epitaxially and sequentially grown on the substrate 2.

The substrate 2 may be a silicon carbide (SiC). The buffer layer 3, which has a function of nucleus forming layer for the channel layer 4, may be an aluminum nitride (AlN) and has a thickness of 10 to 20 nm, which means that the buffer layer 3 is not continuous on the substrate 2 but may constituted from islands. The channel layer 4, which operates as a carrier transporting layer, may be intrinsic type gallium nitride (i-GaN). A GaN layer is unable to be epitaxially grown directly on a SiC substrate because of lesser wettability between GaN and SiC. Accordingly, the GaN channel layer 4 is grown on the SiC substrate 2 interposing the AlN buffer layer 3 therebetween. The channel layer 4 has a thickness of 0.4 to 2.0 µm.

The barrier layer 5, which has a function of carrier generating layer, may have an electron affinity smaller than that of the GaN channel layer 4. The barrier layer 5 has bandgap energy greater than that of the GaN channel layer 4, for instance, the barrier layer 5 may be an aluminum gallium nitride (AlGaN), indium aluminum nitride (InAlN), indium aluminum gallium nitride (InAlGaN), and so on; while, the channel layer is made of GaN. The HEMT 1 of the present embodiment has the barrier layer 5 made of AlGaN. The AlGaN barrier layer 5 and the GaN channel layer 4 causes stresses in regions closer to an interface therebetween due to lattice mismatching between two materials, where the stresses induces piezo charges in the interface, exactly, in the GaN channel layer 4 at the interface against the AlGaN barrier layer 5, which forms a two-dimensional electron gas (2DEG) in the GaN channel layer at the interface. The barrier layer 5 may have a thickness of 5 to 30 nm. Also, the barrier layer 5 may have an n-type conduction, where electrons derived from donors in the barrier layer 5 are added to the piezo-charges to form the channel in the GaN channel layer 4.

The cap layer 6, which is epitaxially grown on the barrier layer 5, may have a thickness smaller than 5 nm. The cap layer 6 is not always provided in the HEMT 1. Also, the cap layer 6 may have the n-type conduction.

The source electrode 7 is in contact with the barrier layer 5 within a recess $R_1$ formed in the surface of the semiconductor stack S. Also, the drain electrode 8 is in contact with the barrier layer 5 within another recess $R_2$ formed in the semiconductor stack S. The electrodes of the source 7 and the drain 8 are sometimes called as an ohmic electrode showing non-rectifying performance in a current-to-voltage characteristic. The electrodes of the source 7 and the drain 8 may be formed by allowing stacked metals of titanium (Ti) and aluminum (Al) with thicknesses around 30 nm and 300 nm, respectively. Titanium (Ti) may be substituted in tantalum (Ta). Also, the stacked metals for the ohmic electrodes, 7 and 8, may provide another Ti, or Ta, with a thickness around 30 nm in a top thereof.

The passivation film 9 protects the semiconductor stack S and the ohmic electrodes, 7 and 8, mechanically and chemically. The passivation film 9 includes a first silicon nitride (SiN) film 11 on the semiconductor stack S and a second SiN film 12 on the former SiN film 11. The first SiN film 11, which protects the cap layer 6, is in contact with the cap layer 6 and the ohmic electrodes, 7 and 8. The first SiN film 11 may have a thickness of 10 to 60 nm and a composition thereof unnecessary to be a stoichiometric composition ($Si_3N_4$), and may have a Si-rich composition. The first SiN film 11 of the present embodiment may be deposited by the low pressure chemical vapor deposition (LPCVD) technique and have refractive index of 2.2. to 2.5. The first SiN film 11 also provides openings, 11a to 11c, where the openings, 11a and 11b, expose the first and second recesses, $R_1$ and $R_2$, therein, while the rest opening 11c exposes the cap layer 6 and has a tapered cross section thereof with a bottom width $W_1$ of 80 to 200 nm.

The second SiN film 12, which may reinforce the former SiN film 11, is not in contact with the cap layer 6. The second SiN film 12 may have a thickness of 20 to 80 nm. The second SiN film 12 is unnecessary to have a stoichiometric composition ($Si_3N_4$) but has refractive index thereof smaller than that of the first SiN film 11. Specifically, the second SiN film 12 has the refractive index greater than 1.85 but smaller than 2.1, preferably smaller than 2.0. The second SiN film 12 of the present embodiment is formed by the plasma-assisted chemical vapor deposition (p-CVD) technique.

The second SiN film 12 also provides openings, 12a to 12C, where the former two openings, 12a and 12b, expose the source electrode 7 and the drain electrode 8, respectively; while the last opening 12C overlaps with the opening 11c in the first SiN film 11 to expose the cap layer 6 and the opening 11c therein. The last opening 12C also has a tapered cross section with a bottom width $W_2$ of 100 to 220 nm. Moreover, the opening 12C and the opening 11c have, or substantially have a common center. Because the opening 12C in the second SiN film 12 has an area wider than the opening 11c, the first SiN film 11 may form a step in the opening 12C in the second SiN film 12.

The first SiN film 11, as described above, is deposited by the LPCVD technique, while, the second SiN film 12 is deposited by the p-CVD technique, which means that the first SiN film 11 is compact and dense compared with the second SiN film 12, and the first SiN film 11 has hydrogen concentration thereof smaller than that in the second SiN film 12. Accordingly, the first SiN film 11 has the refractive index greater than that of the second SiN film 12. Also, when both SiN films, 11 and 12, are dry-etched using a reaction gas containing fluorine (F), such as carbon tetra-fluoride ($CF_4$), sulfur hexa-fluoride ($SF_6$), and so on, the first SiN film 11 shows an etching rate thereof smaller than that for the second SiN film 12. For instance, although depending on various conditions, the etching rate of the first SiN film 11 by $SF_6$ is almost ⅓ of the etching rate for the second SiN film 12, while, the etching rate for the first SiN film 11 by $CF_4$ is almost ⅔ of that for the second SiN film 12.

The gate electrode 10, which fills the opening 11c in the first SiN film 11 and the opening 12C in the second SiN film 12, is in contact with the cap layer 6 in the top of the semiconductor stack S. The gate electrode 10 has a cross section of a T-character with a height thereof greater than a total thickness of the first and the second SiN films, 11 and 12, which is, for instance, thicker than 300 nm but thinner than 900 nm. The gate electrode 10, as shown in FIG. 1, fully covers the cap layer 6 exposed within the opening 11c in the first SiN film 11. The gate electrode 10 includes a first metal 21 containing nickel (Ni) and a second metal 22 free from Ni.

The first metal 21, which is in contact with the cap layer 6, is formed within the opening 11c in the first SiN Film 11. The first metal 21 of the present embodiment is formed in the opening 11c so as to fully cover the cap layer 6 and partly in the opening 12c; that is, the first metal 21 has a height greater than the thickness of the first SiN film 11 but smaller than a total thickness of the two SiN films, 11 and 12, specifically, the first metal 21 has the thickness of 30 to 60 nm. The first metal 21 has a trapezoidal cross section with a width $W_3$ of the lower base of the trapezoid substantially equal to the width $W_1$ of opening 11c, where the former width $W_3$ corresponds to a gate length of the HEMT 1. The bottom width $W_3$ of the first metal 21, namely, the gate length of the HEMT 1 is greater than 50 nm but smaller than 200 nm, which is narrower than the bottom width $W_2$ of the opening 12c in the second SiN film 12. Accordingly, each side of the trapezoid, that is, the outer wall of the first metal 21 is apart from an inner wall of the opening 12c of the second SiN film 12 by a second gap in the opening 12c so as to expose the step formed by the first SiN film 11 in the opening 12c of the second SiN film 12. The first metal 21 in the bottom width $W_3$ thereof may be shorter than the bottom width $W_1$ of the opening 11c to form a first gap in the opening 11c between the outer wall of the first metal 21 and an inner wall of the opening 11c, or greater than the bottom width $W_1$ so as to partly cover the first SiN film 11 around the opening 11c thereof, but is necessary to be apart from the second SiN film 12.

The second metal 22 fills the opening 12c in the second SiN film 12 so as to cover the first metal 21. Specifically, the second metal 22 in a portion thereof fills the first and second gaps in the openings, 11c and 12c, not filled with the first metal 21, and in another portion thereof extends on the second SiN film 12 around the opening 12c. That is, the first metal 21 is apart from the second SiN film 12 by filling the second gap therebetween with the second metal 22. As seen in FIG. 1, the second gap between the outer wall of the first metal 21 and the second SiN film 12 is directly above and continuous with the first gap between the outer wall of the first metal 21 and the first SiN film 11. The second metal 22 may be a mono-layer made of, for instance gold (Au) or a stacked layer of titanium, platinum, and gold (Ti/Pt/Au), where Ti is in contact with the first metal 21 and the second SiN film 12. The second metal 22 may have a thickness of 200 to 500 nm and a root width $W_4$ at the second SiN film 12 greater than the bottom width $W_3$ of the first metal 21. The width $W_4$ of the second metal 22 may be 300 to 800 nm, which is about 200 nm greater in one side thereof than the bottom width $W_3$ of the first metal 21.

Figure 2A:
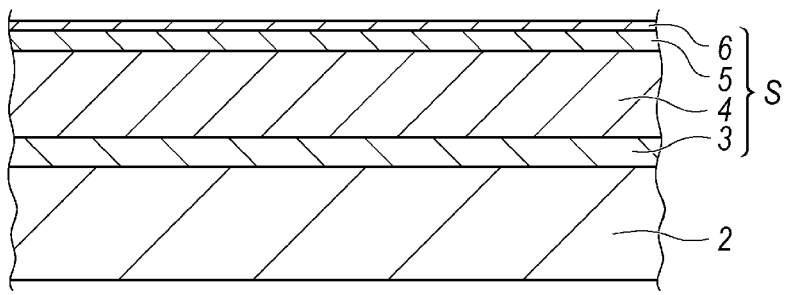
FIG. 2A to FIG. 2C are cross sectional views of the semiconductor device shown in FIG. 1 at respective steps of the process of forming the device.
Figure 2B:
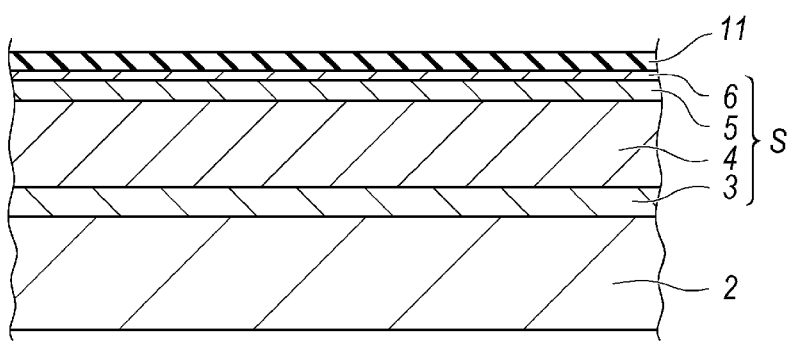
Figure 2C:
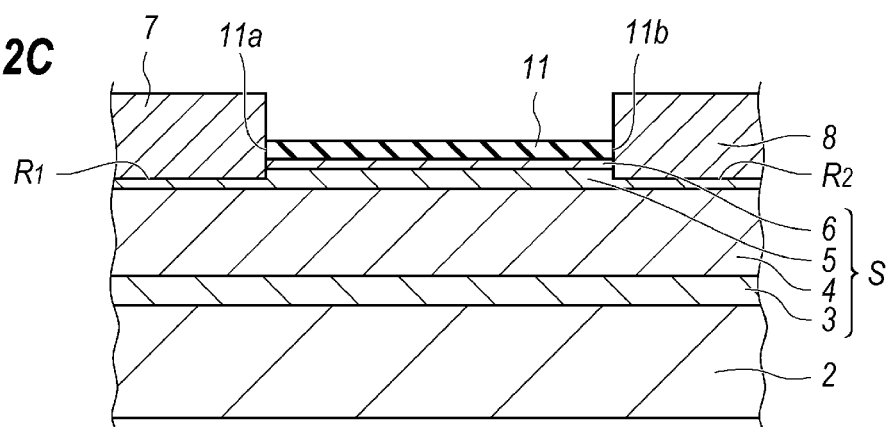
Figure 3A:
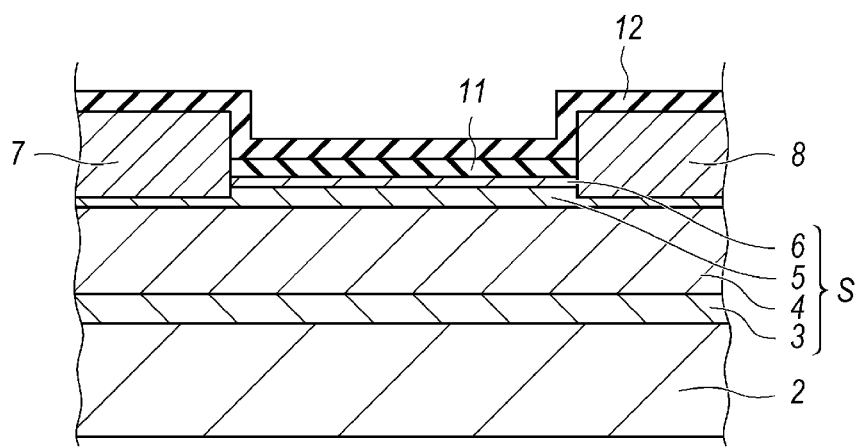
FIG. 3A and FIG. 3B are cross sectional views of the semiconductor device at respective steps of the process subsequent to the step shown in FIG. 2C.
Figure 3B:
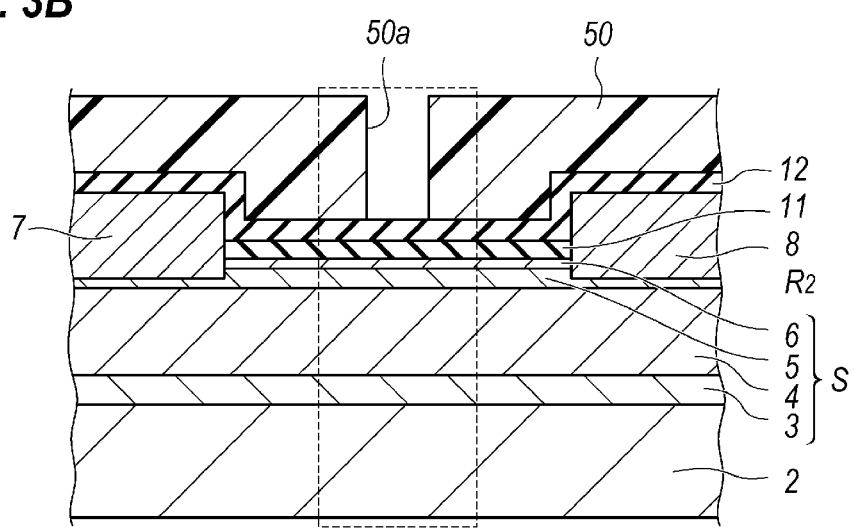

Next, a process of forming the semiconductor device 1 according to an embodiment will be described referring to FIG. 2 to FIG. 5, where FIG. 2A to FIG. 3B show the semiconductor device in respective cross sectional views at steps of the process, while, FIG. 4A to FIG. 5B magnifies a primary portion around the gate electrode 10 and surrounded by a broken square indicated in FIG. 3B in respective cross sectional views at steps of the process.

First, as shown in FIG. 2A, the process forms a semiconductor stack S on the substrate 2 by the metal organic chemical vapor deposition (MOCVD) technique, where the MOCVD technique sequentially and epitaxially grows the AlN layer of the buffer layer 3, the GaN layer of the channel layer 4, the AlGaN layer of the barrier layer 5, and the GaN layer of the cap layer 6. Thereafter, as shown in FIG. 2B, the process forms the first SiN film 11 on the semiconductor stack S by the LPCVD technique, where the LPCVD technique sets the deposition conditions of the deposition pressure of 10 to 100 Pa and the deposition temperature of 650 to goo ° C. Also, the LPCVD technique supplies ammonia ($NH_3$) and di-chloro-silane ($SiH_2Cl_2$) as source materials for nitrogen (N) and silicon (Si), respectively. In an alternative, the LPCVD technique may supply nitrogen ($N_2$) and mono-silane ($SiH_4$) as the source materials for N and Si, respectively. Flow rates of the respective source materials are selected for the first SiN film 11 to be a Si-rich composition. That is, the flow rate of the source material for Si is set to be greater from a rate that makes an SiN film stoichiometric. The present embodiment deposits the first SiN film 11 by a thickness of 20 nm at the conditions of the deposition temperature and the deposition pressure to be 850° C. and 50 Pa, respectively; while, the $SiH_2Cl_2$ and $NH_3$ are used as the source materials.

Thereafter, as shown in FIG. 2C, the electrodes of the source 7 and the drain 8 are formed on the semiconductor stack S. Specifically, the process partly removes, for instance, by a reactive ion etching (RIE) technique, the first SiN film 11, the cap layer 6, and a portion of the barrier layer 5 in regions where the electrodes of the source 7 and the drain 8 are to be formed. The RIE may fully remove the barrier layer 5 to expose the surface of the channel layer 4 in the regions, or may leave a portion of the barrier layer 5. Also, the RIE technique may remove only the first SiN film 11 to expose the surface of the semiconductor stack S, namely, the surface of the cap layer 6. Then, stacked metals of titanium (Ti) and aluminum (Al) are formed within the recesses, $R_1$ and $R_2$, by the vacuum evaporation. Alloying the stacked metals of Ti and Al at a temperature of 550 to 600° C. and for five (5) minutes, the electrodes of the source 7 and the drain 8 each showing non-rectifying characteristic may be formed within the respective recesses, $R_1$ and $R_2$. The process of alloying the stacked metals also heats the first SiN film 11, which may eliminate hydrogen ($H_2$) inherently contained in the first SiN film 11 formed by the LPCVD technique and make the first SiN film 11 further compact.

Thereafter, as shown in FIG. 3A, the process deposits the second SiN film 12 by the p-CVD technique on the first SiN film 11 and the electrodes of the source 7 and the drain 8, where the p-CVD technique sets conditions of the deposition temperature lower than the deposition temperature for the first SiN film 11, for instance lower than 350° C. The present embodiment sets the deposition temperature and the deposition pressure to be 315° C. and 10 Pa, respectively. Also, the p-CVD technique supplies $SiH_4$ and $NH_3$ as the source materials for Si and N, respectively. Those source materials are diluted by nitrogen ($N_2$). The second SiN film 12 of the present embodiment may be formed with a thickness of 40 nm.

Thereafter, as shown in FIG. 3B, the process spin-coats a photoresist 50 on the second SiN film 12 and forms an opening 50a in the photoresist by the electron beam (EB) exposure accompanying with subsequent development, where the opening 50a is formed in a position where the opening 11c in the first SiN film 11 is to be formed.

Figure 4A:
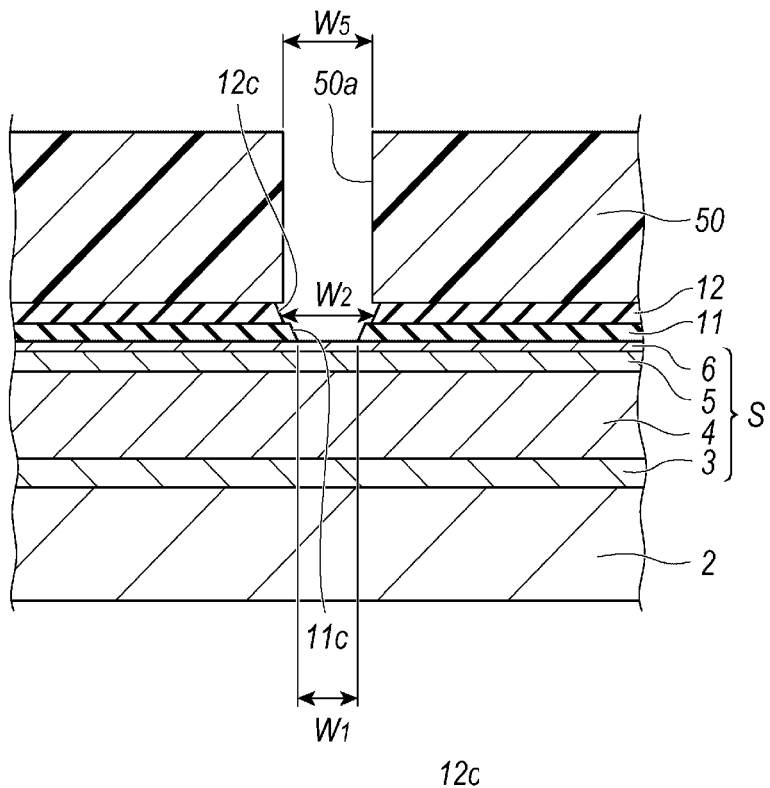
FIG. 4A and FIG. 4B are cross sectional views of the semiconductor device at respective steps of the process subsequent to the step shown in FIG. 3B.

Thereafter, as shown in FIG. 4A, the process sequentially forms the opening 12C in the second SiN film 12 and the opening 11c in the first SiN film 11. Specifically, the RIE technique using a reactive gas containing fluoride (F) such as carbon tetra-fluoride ($CF_4$), sulfur hexa-fluoride ($SF_6$), and so on may form the openings, 12C and 11c, by the patterned photoresist 50 with the opening 50a as an etching mask. The present embodiment of the process adopts etching conditions of the etching gas of $SF_6$ from a viewpoint of isotropic etching for the SiN films, 11 and 12, the RF power of 100 W, the etching pressure of 1 Pa, and at a room temperature. As described above, the first SiN film 11 shows an etching rate smaller than that for the second SiN film 12, the RIE technique etches the second SiN film 12 more than the first SiN film 11. Also, the second SiN film 12 is exposed for the RF plasma longer than the first SiN film 11, which forms the opening 12C in the second SiN film 12 wider than the opening 11c in the first SiN film 11; that is the second SiN film 12 may cause a greater side etching than the first SiN film 11. The greater side etching in the second SiN film 12 makes the width $W_2$ of the opening 12C in the second SiN film 12 that is wider than the width $W_5$ of the opening 50a in the patterned photoresist 50 to form the overhang in the patterned photoresist 50 against the opening 12C in the second SiN film 12.

Figure 4B:
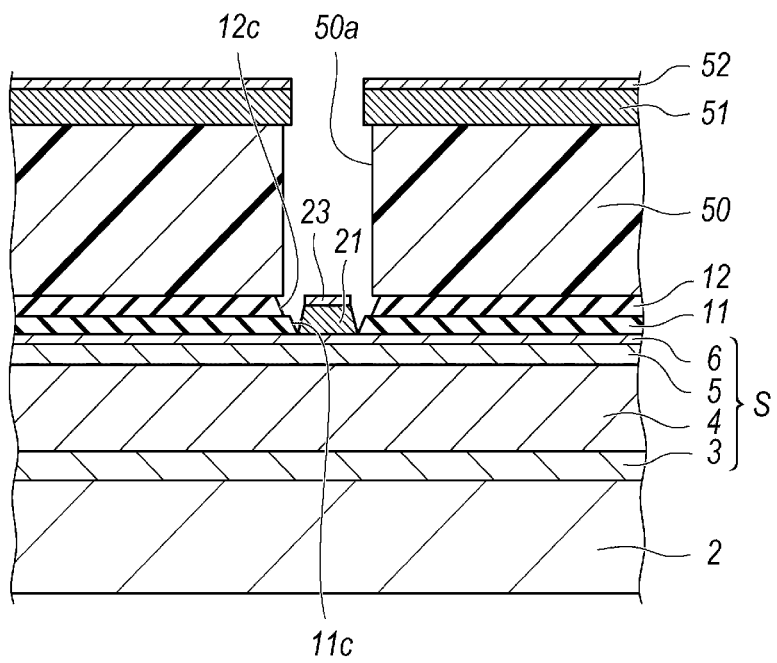

Thereafter, as shown in FIG. 4B, the first metal 21 is formed on the semiconductor stack S. Specifically, a physical deposition technique, such as the vacuum evaporation, may sequentially deposit the first metal 21 so as to be in contact with the cap layer 6 exposed within the openings, 12C and 11c, in the SiN films, 11 and 12, and the barrier metal 23 not only to prevent the first metal 21 from oxidizing and causing corrosion but also to enhance adhesiveness of the second metal 22 against the first metal 21. The barrier metal 23 may be titanium (Ti), platinum (Pt), palladium (Pd), and so on. The first metal 21 and the barrier metal 23 have a total thickness thinner than the total thickness of the first and second SiN films, 11 and 12, from a viewpoint to easily remove the patterned photoresist 5o. The present embodiment deposits the first metal 21 and the barrier metal 23 by respective thickness of 50 nm and 10 nm. Because the patterned photoresist 50 forms the overhang in the opening 50a thereof against the second SiN film 12, the first metal 21 and the barrier metal 23 may be apart from the patterned photoresist 5o. The deposition of the first metal 21 and the barrier metal 23 avoids the first SiN film 11. Specifically, the surface of the first SiN film 11 exposed within the opening 12C in the second SiN film 12 is preferably not covered with the first metal 21 and the barrier metal 23 in FIG. 4B but the first SiN film 11 in an edge thereof forming the opening 11c may be covered with the first metal 21 and the barrier metal 23. A key feature of the arrangement shown in FIG. 4B is that the first metal 21 and the barrier metal 23 are not in contact with the second SiN film 12. Residual metals, 51 and 52, are left on the patterned photoresist 50.

Figure 5A:
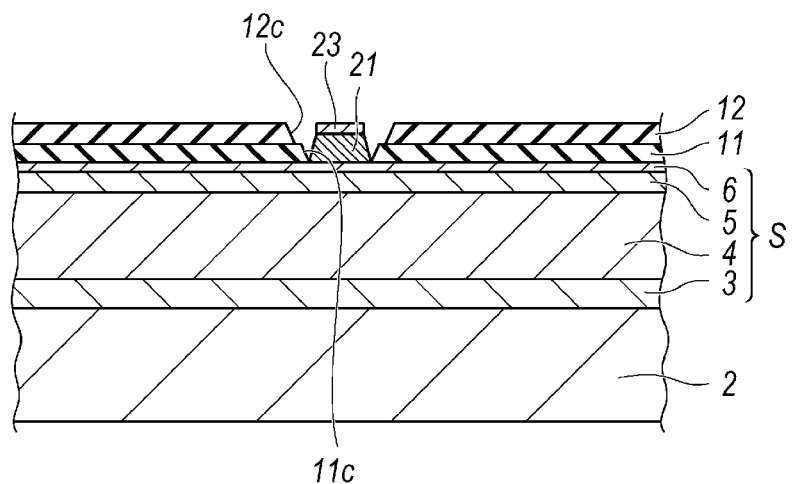
FIG. 5A and FIG. 5B are cross sectional views of the semiconductor device at respective steps of the process subsequent to the step shown in FIG. 4B.

Thereafter, as shown in FIG. 5A, the patterned photoresist 50 is removed accompanied with the residual metals, 51 and 52, left thereon by soaking the substrate 2 within an organic solvent, which may be called as the lift-off technique. Because the first metal 21 and the barrier metal 23 are apart from the patterned photoresist 50, only the residual metals, 51 and 52, are removed, and the first metal 21 and the barrier metal 23 are left on the semiconductor stack S.

Figure 5B:
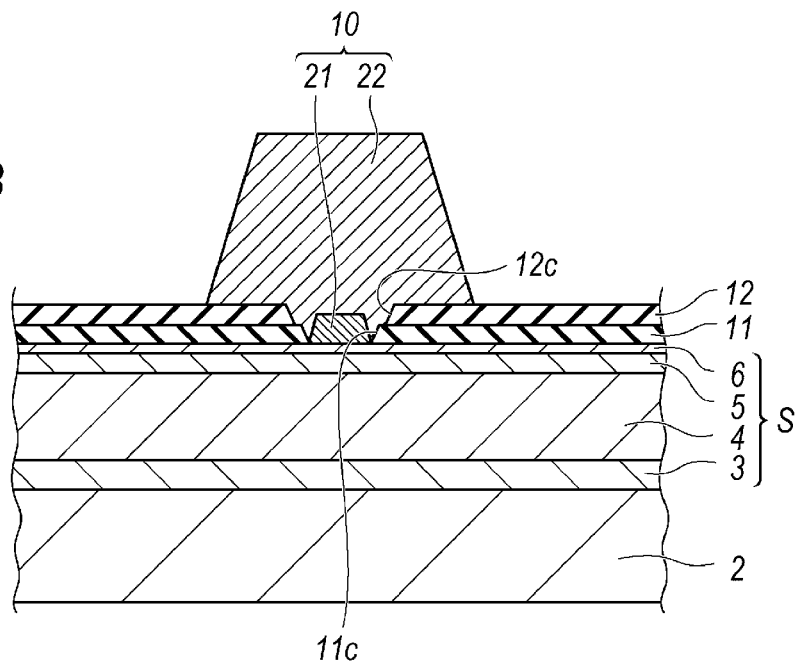

Thereafter, as shown in FIG. 5B, the process further forms the second metal 22 that covers the first metal 21 and fills the opening 12C in the second SiN film 12. Specifically, another patterned photoresist, which is not illustrated in the figures, with an opening that fully exposes the opening 12C in the second SiN film 12 and the surface of the second SiN film 12 around the opening 12C thereof, is prepared. The physical deposition of the second metal 22 using the other photoresist may form the second metal 22. Removing a residual metal left on the other photoresist by the lift-off technique, the second metal 22 is left on the second SiN film 12 so as to fully cover the first metal 21 and the barrier metal 23, and the surface of the second SiN film 12 around the opening 12C thereof. Thus, the process of forming the HETM 1 shown in FIG. 1 is completed. Another insulating film may cover the second metal 22 and the second SiN film 12 to physically and chemically protect the gate electrode 10.

Next, advantages of the semiconductor device according to the embodiments of the present invention and the process of forming the same will be described referring to FIG. 6A and FIG. 6B that are cross sectional views of a conventional semiconductor device.

Figure 6A:
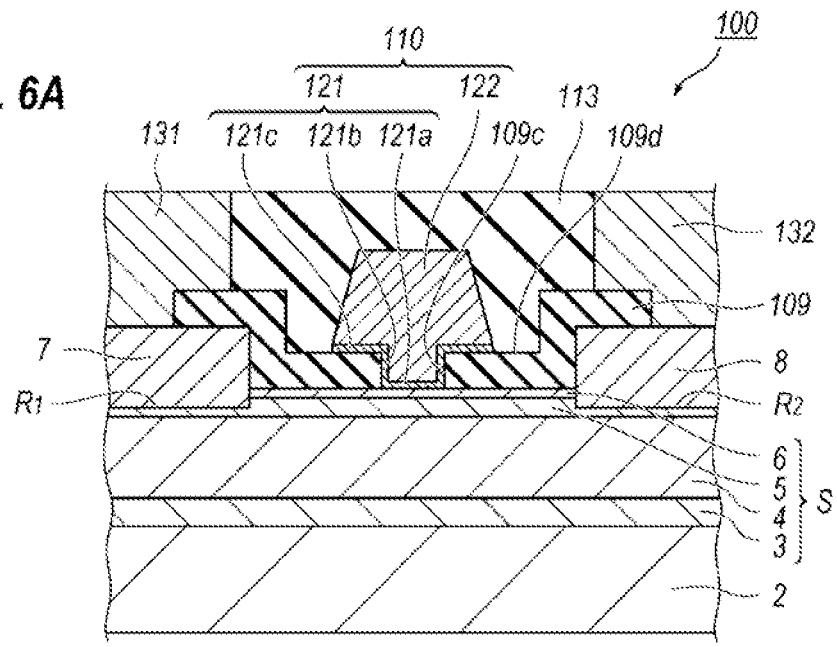
FIG. 6A and FIG. 6B are cross sectional view s of a semiconductor device with a conventional arrangement providing no elements or structures to prevent Ni atoms from diffusing into an SiN film.

As shown in FIG. 6A, a HEMT 100 of a conventional example provides, similar to the semiconductor device of the embodiment, the semiconductor stack S with the recesses, $R_1$ and $R_2$, the electrodes of the source 7 and the drain 8 within the recesses, $R_1$ and $R_2$, the SiN film 109, and the gate electrode 110. However, the SiN film 109 of the conventional device 100 is formed in a mono-layer and by the p-CVD technique different from the embodiment. The gate electrode 110 of the conventional one, which has a cross section of a T-character, contains a Ni layer 121 in contact with the SiN film 109 and the semiconductor stack S, and an Au layer 122 on the Ni layer 121. The Ni layer 121 includes a first portion 121a in direct contact with the cap layer 6, a second portion 121b in contact with an end or an edge of the SiN film 109, and a third portion 121C extending on a top surface of the SiN film 109 around the opening 109c. The conventional HEMT shown in FIG. 6A and FIG. 6B further provides the source interconnection 131 extending from the source electrode 7, the drain interconnection 132 extending from the drain electrode 8, and the passivation film 113 that covers the SiN film 109 and the gate electrode 110, where the passivation film 113 is made of SiN and formed by the p-CVD lip technique.

Figure 6B:
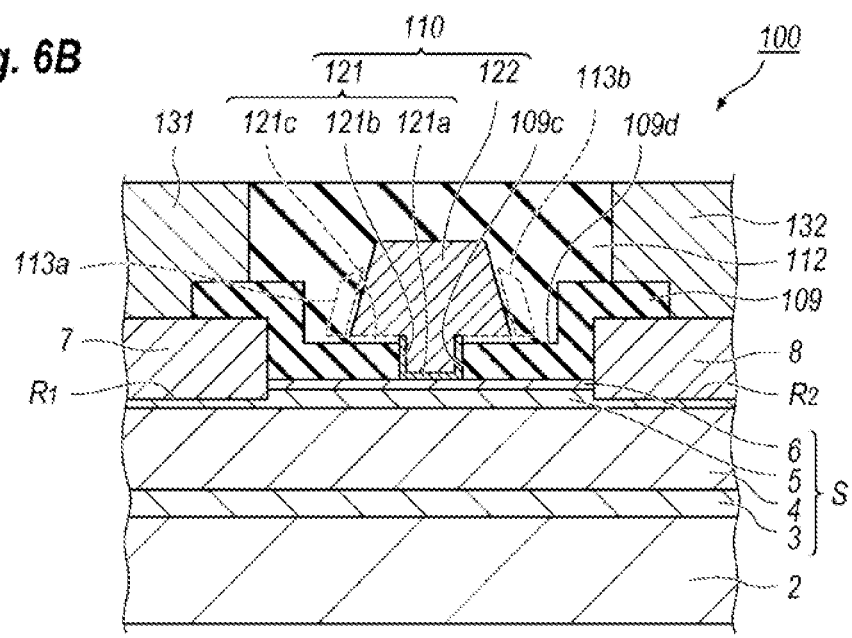

As shown in FIG. 6B, a portion of Ni layer 121 may diffuse into SiN films 113 surrounding the gate electrode 110. For instance, the Ni atoms in the Ni layer 121 may diffuse into portions, 113a and 113b, of the passivation film 113 in contact with the edges of the third portion 121C in the Ni layer 121. Inspecting the gate electrode 110 by the transmission electron microscope (TEM), the first portion 121a in the Ni layer 121 has crystal quality better than that of the third portion 121C, which seems that the first portion 121a may reflect the crystal quality of the cap layer 6 existing therebeneath; while, the third portion 121C, which is deposited on the surface 109d of the SiN film 109 that is non-crystallized, shows lesser crystal quality that accelerates the diffusion of the Ni atoms compared with the first portion 121a.

The HEMT 1 of the present invention, which is formed by the process according to the embodiment of the present invention, provides the double SiN films, 11 and 12, where the former SiN film is formed by the LPCVD technique, while, the latter is formed by the p-CVD technique, and the gate electrode 10 includes two metals, 21 and 22, where the former metal 21 contains Ni and isolated from the second SiN film 12, while, the latter is free from Ni but in contact with the second SiN film 12. The first SiN film 11 provides the opening 11c with the width $W_1$ into which the first metal 21 is formed so as to be apart from the second SiN film 12 that is provided on the first SiN film 11 and has the opening 12C with the width $W_2$ greater than the width $W_1$ of the opening 11c. Because only the second metal 22 that is free from Ni is in contact with the second SiN film 12 formed by the p-CVD technique, while, the first metal 21 containing Ni is apart from the second SiN film 12 interposing with the second metal 22 therebetween, the diffusion of the Ni atoms in the first metal 21 into the second SiN film 12 with a relatively sparse characteristic may be effectively prevented.

The first metal 21 has the thickness smaller than a total thickness of the first and second SiN films, 11 and 12, which securely forms a gap between the deposited first metal 21 and the residual metals deposited on the patterned photoresist 5o. Accordingly, the lift-off technique for removing the residual metals deposited on the patterned photoresist 50 becomes easy and the first metal 21 is effectively prevented from being removed by the removal of the patterned photoresist.

The first SiN film 11 is deposited by the LPCVD technique at the deposition temperature higher than 650° C., while, the second SiN film 12 is deposited by the p-CVD technique at the deposition temperature lower than 350° C., which may dearly distinguish two SiN films, 11 and 12, by the compactness or the sparseness in film quality thereof. That is, the first SiN film 11 becomes compact and hard compared with the second SiN Film 12, which results in a wider selectiveness in the formation of the openings, 12C and 11c, in the respective films, 12 and 11. That is, the first SiN film 11 shows a smaller etching rate in the RIE process compared with that for the second SiN film 12. Accordingly, the opening 12C in the second SiN film 12 becomes wider than the opening 11c in the first SiN film 11 even when the second and first SiN films, 12 and 11, are sequentially etched by the conditions same with each other.

The first SiN film 11, which is formed by the LPCVD technique in conditions by which an SiN film becomes a Si-rich composition, has the refractive index greater than 2.2, while, the second SiN film 12, which is formed by the p-CVD technique in conditions by which an SiN film has substantially stoichiometric composition, shows the refractive index smaller than 2.1, preferably smaller than 2.0.

Figure 7A:
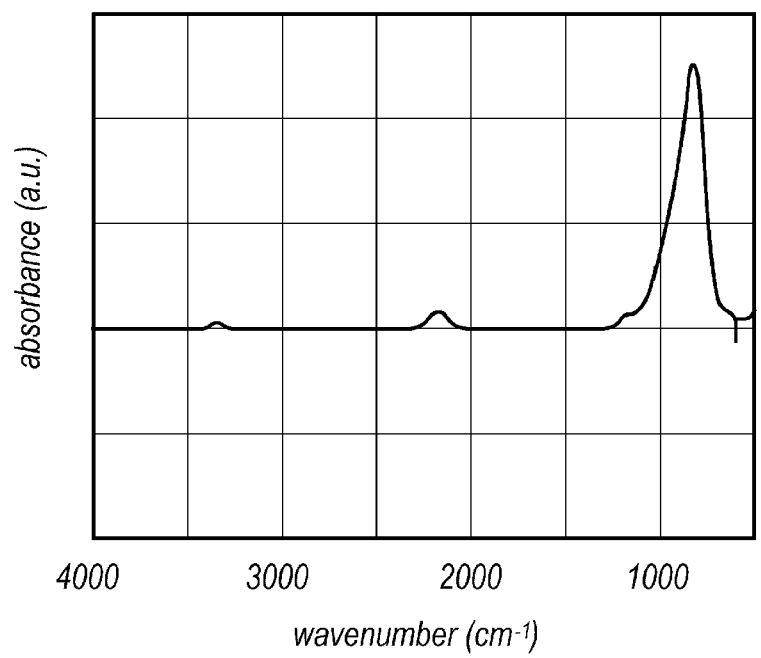
FIG. 7A and FIG. 7B compare FTIR spectra of SiN films formed by the plasma assisted chemical vapor deposition (p-CVD) technique and another SiN film formed by a low-pressure chemical vapor deposition (LPCVD) technique.
Figure 7B:
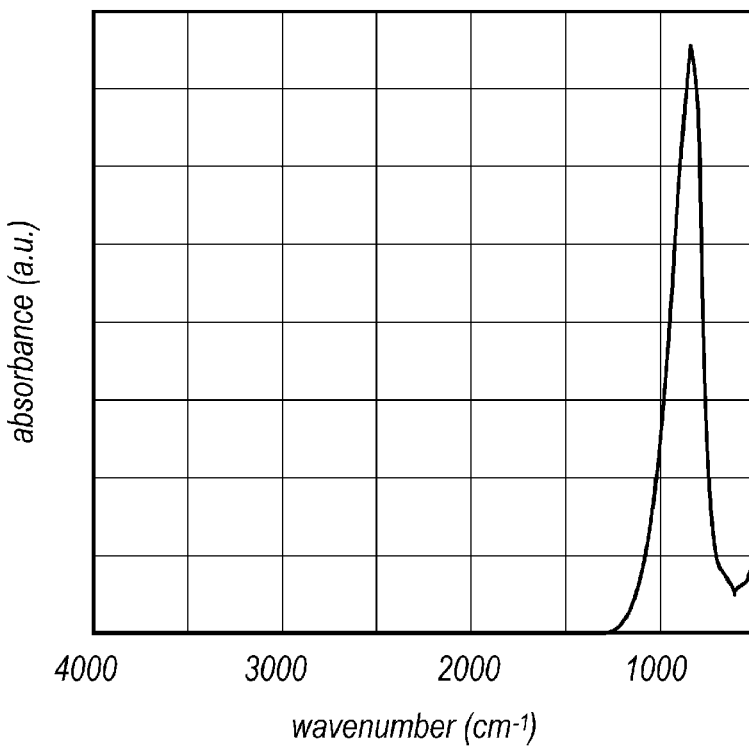

FIG. 7A and FIG. 7B compare spectra of SiN films formed by the p-CVD technique (FIG. 7A) and the LPCVD technique (FIG. 7B) measured by the Fourier Transform Infrared Spectroscopy (FT-IR). In FIG. 7A and FIG. 7B, horizontal axes correspond to the wavenumber, while, vertical axes show the absorbance of the respective films. The FTIR spectrum shown in FIG. 7A shows a small peak around 2200 $cm^{-1}$, while, the FTIR spectrum shown in FIG. 7B causes no additional peaks except for that around 800 $cm^{-1}$. A peak observed around 2200 $cm^{-1}$ in the FTIR spectrum is derived from a stretching vibration of a Si—H bond. Accordingly, it may be estimated that an SiN film deposited by the p-CVD technique (FIG. 7A) has hydrogen (H) concentration greater than that in another SiN film deposited by the LPCVD technique (FIG. 7B). Thus, an SiN film deposited by the LPCVD technique shows better film quality compared with an SiN film deposited by the p-CVD technique (FIG. 7A).

While particular embodiments of the present invention have been described for purposes of illustration, many modifications and changes will become apparent to those skilled in the art. For instance, the semiconductor stack S may include other layers except for the buffer layer 3, the channel layer 4, the barrier layer 5, and the cap layer 6. Also, the first metal 21 in the gate electrode 10 in the embodiment fully covers the cap layer 6 exposed in the opening 11c of the first SiN film 11. However, a key feature of the invention is that the first metal 21 containing Ni is physically apart from at least an SiN film deposited by the p-CVD technique; because an SiN film deposited by the LPCVD technique generally shows better compactness compared with an SiN film deposited by the p-CVD technique, which means that the Ni atoms are hard to diffuse into an SiN film formed by the LPCVD technique. Accordingly, the first metal 21 containing Ni is unnecessary to be apart from the first SiN film 11 and may extend on the first SiN film 11.

Also, the embodiment provides the barrier metal 23 in the first metal 21 to prevent the Ni atoms from diffusing into the second metal 22. However, when the diffusion of the Ni atoms into the second metal 22 induces no or substantially no degradation in the gate metal 10, the first metal 21 is unnecessary to provide the barrier metal. Even in such an arrangement without the barrier metal, the first metal preferably has a thickness smaller than the total thickness of the first and second SiN films, 11 and 12.

Also, the embodiment forms the second metal 22 by the sequential process of the physical deposition of the second metal 22 and the subsequent lift-off technique for removing the residual metals deposited on the patterned photoresist 5o. However, the process of depositing the second metal 22 may take another technique. For instance, the second metal 22 may be deposited by electrolytic plating of gold (Au). That is, depositing a seed metal on a whole surface of the second SiN film 12 and the first metal 21 after forming the first metal 21, and preparing another patterned photoresist providing an opening corresponding to the second metal 22, the second metal 22 may be selectively plated on the seed metal exposed within the opening in the another photoresist. Removing the seed metal exposed from the second metal 22 by, for instance, the ion-milling technique, the gate electrode 10 with the first metal 21 within the opening 11c and the second metal covering the first metal 21 and extending on the second SiN film 12 around the opening 12C thereof may be formed. Accordingly, the appended claims are intended to encompass all such modifications and changes as fall within the true spirit and scope of this invention.

What is claimed is:

1. A semiconductor device type of a high electron mobility transistor (HEMT), comprising:
   a semiconductor layer provided on a substrate;
   a first silicon nitride (SiN) film provided on the semiconductor layer, the first SiN film having a first opening;
   a second SiN film provided on the first SiN film, the second SiN film having a second opening formed therein that fully overlaps with and includes the first opening in the first SiN film; and
   a gate electrode including a first metal containing nickel (Ni) and a second metal being free from Ni,
   the first metal being in the first opening of the first SiN film with a first gap formed in the first opening between an outer wall of the first metal and an inner wall of the first opening in the first SiN film, and being in contact with the semiconductor layer exposed in the first opening of the first SiN film while being spaced apart from the second SiN film by a second gap formed in the second opening, and
   the second metal covering the first metal and filling the second opening of the second SiN film, wherein
   a portion of the second metal fills the first gap, and another portion of the second metal fills the second gap,
   of the metals of the gate electrode, only the second metal contacts the second SiN film, and
   the second SiN film is not in contact with a metal containing Ni.

2. The semiconductor device according to claim 1, wherein the first metal has a thickness smaller than a total thickness of the first SiN film and the second SiN film.

3. The semiconductor device according to claim 2, wherein the first SiN film has a thickness of 10 to 60 nm, and the second SiN film has a thickness of 20 to 80 nm.

4. The semiconductor device according to claim 1, wherein the Ni in the first metal has a thickness of 50 nm.

5. The semiconductor device according to claim 1, wherein the second metal is gold (Au) with a thickness of 200 to 500 nm.

6. The semiconductor device according to claim 1, wherein the first SiN film has a refractive index greater than 2.2 and the second SiN film has a refractive index smaller than 2.1.

7. The semiconductor device according to claim 1,
wherein the first SiN film has compactness greater than the second SiN film.

8. The semiconductor device according to claim 1,
wherein the first metal partially covers an edge of the opening of the first SiN film while being physically apart from the second SiN film.

9. The semiconductor device according to claim 1,
wherein the second gap is directly above the first gap, and the first and second gaps form a continuous space.

10. The semiconductor device according to claim 1,
wherein the second gap is formed in the second opening between the outer wall of the first metal and an inner wall of the second opening in the second SiN film.

11. The semiconductor device according to claim 10,
wherein the second gap is directly above the first gap, and the first and second gaps form a continuous space.

12. The semiconductor device according to claim 1,
wherein, in cross section, the first metal is in the shape of a trapezoid with the outer wall of the first metal being a side wall of the trapezoid and thereby forming the first gap with the inner wall of the first opening.

\* \* \* \* \*